(12) United States Patent
Kambe et al.

(10) Patent No.: US 12,293,249 B2
(45) Date of Patent: May 6, 2025

(54) PRESSURE SENSOR AND OPTICAL INFORMATION READER

(71) Applicant: DENSO WAVE INCORPORATED, Aichi-pref. (JP)

(72) Inventors: Kazumi Kambe, Chita-gun (JP); Akira Ito, Chita-gun (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 378 days.

(21) Appl. No.: 17/975,426

(22) Filed: Oct. 27, 2022

(65) Prior Publication Data

US 2023/0129309 A1    Apr. 27, 2023

(30) Foreign Application Priority Data

Oct. 27, 2021 (JP) .................................. 2021-175815

(51) Int. Cl.

| | | |
|---|---|---|
| *G06K 7/10* | (2006.01) | |
| *G01L 1/16* | (2006.01) | |
| *G01L 5/22* | (2006.01) | |
| *G01R 19/165* | (2006.01) | |
| *G06F 3/02* | (2006.01) | |
| *H10N 30/30* | (2023.01) | |

(52) U.S. Cl.
CPC ............ *G06K 7/10881* (2013.01); *G01L 1/16* (2013.01); *G01L 5/22* (2013.01); *G01R 19/16576* (2013.01); *G06F 3/02* (2013.01); *G06K 2007/10524* (2013.01); *H10N 30/30* (2023.02)

(58) Field of Classification Search
CPC ......... G01R 19/16576; G06K 7/10881; G06K 2007/10524; G06F 3/02; G01L 1/16; G01L 5/22; H10N 30/30
USPC ........................................................ 367/155
See application file for complete search history.

(56) References Cited

U.S. PATENT DOCUMENTS

| | | | |
|---|---|---|---|
| 2012/0194472 A1* | 8/2012 | DaCosta | G06F 3/0418 345/173 |
| 2015/0268786 A1* | 9/2015 | Kitada | G06F 3/0486 345/173 |
| 2015/0338981 A1* | 11/2015 | Ando | G06F 3/04144 349/12 |
| 2017/0083693 A1* | 3/2017 | Bengtsson | G06F 21/32 |
| 2017/0242541 A1* | 8/2017 | Luchi | G06F 3/0446 |
| 2018/0058954 A1* | 3/2018 | Kihara | G01L 5/167 |
| 2018/0062650 A1* | 3/2018 | Hattori | G06F 3/044 |
| 2018/0314365 A1* | 11/2018 | Kihara | G06F 3/044 |
| 2019/0036528 A1* | 1/2019 | Mori | H04Q 9/00 |

(Continued)

*Primary Examiner* — Daniel L Murphy
*Assistant Examiner* — Amie M Ndure
(74) *Attorney, Agent, or Firm* — Oliff PLC

(57) ABSTRACT

A controller samples, after determination of a start of a user's press on a pressable input surface of a pressure sensing member, a value of an output voltage of the pressure sensing member, and determines whether one of a first condition and a second condition is satisfied to accordingly determine whether the user's press on the pressable input surface is terminated. The first condition represents that the sampled value of the output voltage is lower than a predetermined second voltage threshold. The second condition represents that the output voltage has converged to a base voltage. The base voltage is a value of the output voltage of the pressure sensing member with no user's press on the pressable input surface of the pressure sensing member.

17 Claims, 14 Drawing Sheets

(56) References Cited

U.S. PATENT DOCUMENTS

2019/0227649 A1* 7/2019 Micci ...................... G06F 3/016
2020/0033204 A1* 1/2020 Isono ........................ G01L 1/16

* cited by examiner

PRESSURE SENSOR AND OPTICAL INFORMATION READER

CROSS-REFERENCE TO RELATED APPLICATION

This application is based on and claims the benefit of priority from earlier Japanese Patent Application No. 2021-175815 filed on Oct. 27, 2021, the entire disclosure of which is incorporated herein by reference.

TECHNICAL FIELD

The present disclosure relates to pressure sensors and optical information readers for optically reading information, such as information codes.

BACKGROUND

With concern about viral infections as a backdrop, information devices are required to be disinfected with alcohol in not only a medical field but also various fields. From these requirements, users request flat and seamless operation switches without projections and depressions for optical information readers, such as barcode readers, other than conventional trigger switches; these flat and seamless operation switches are easy to wipe.

From this viewpoint, such an optical information reader uses, as its input unit, a touch screen unit mounted to a case of the optical information reader. The touch screen unit is comprised of a touch screen and a pressure sensor. The touch screen unit enables a user to touch the touch screen, so that the pressure sensor measures a deformation of the touch screen based on pressure applied thereto by the user's touch on the touch screen to accordingly turn on or off the optical information reader. As such a pressure sensor, a pressure sensor comprised of a piezoelectric device can be used.

A piezoelectric device is comprised of a pair of first and second electrodes and a piezoelectric body located between the pair of first and second electrodes. The piezoelectric device is configured to, when external pressure is applied to the first electrode so that the piezoelectric body is deformed to generate electrical charges based on the deformation amount of the piezoelectric body. The generated electrical charges are transferred through the first electrode to a load connected to the pair of electrodes, making it possible to measure the deformation amount of the first electrode as a voltage across the load.

As described above, the piezoelectric device is configured to generate electrical charges based on the deformation amount of the first electrode, and therefore not to generate electrical charges when the deformation amount is unchanged. For this reason, if the deformed first electrode is maintained, the voltage has converged to a base voltage, because no new electrical charges are generated by the piezoelectric device; the base voltage represents a voltage that the piezoelectric device with no external force being applied thereto generates. The reason why is as follows. Specifically, in the piezoelectric body of such a piezoelectric device, positive and negative charges are equilibrated with one another so that the piezoelectric device generates the base voltage based on the charge equilibrium state. In contrast, when the first electrode is pressed with a user's finger so that the charge equilibrium state in the piezoelectric body is disturbed, the piezoelectric device generates, based on the deformation of the piezoelectric body, a voltage higher than the base voltage. Therefore, when the pressed state of the piezoelectric device, i.e., the piezoelectric body, is maintained, the disturbed positive and negative charges return to the charge equilibrium state, resulting in the voltage generated by the piezoelectric device returning to the base voltage.

These characteristics of the piezoelectric device enable a pressure sensor using the piezoelectric device to easily detect a user's on-operation and a user's off-operation, but may make it difficult for the pressure sensor, like a physical switch or a capacitive sensor, to detect the state of a deformation amount being maintained, i.e., the state of the first electrode being continuously held down.

For addressing such an issue due to the characteristics of the piezoelectric device, domestic republication No. 2019/069786 of PCT internal publication discloses an improved pressure sensor.

Specifically, the pressure sensor disclosed in the above domestic republication is configured to (I) Determine whether a user's pressing operation of a pressable input portion thereof, which has been started since a time at which the user's pressing operation was determined to be received by the pressable input portion, is released based on comparison of an output voltage level of the pressure sensor based on the user's pressing operation with a predetermined absolute threshold level (II) Change the absolute threshold level to be smaller after a predetermined threshold time has elapsed since the time at which the user's pressing operation was determined to be received by the pressable input portion This aims to detect the state of the pressable input portion being continuously held down, and avoid wrong determination that spring back of the pressable input portion results from a user's pressing of the pressable input portion.

SUMMARY

The configuration of the pressure sensor disclosed in the above patent publication may unfortunately request a user of the pressure sensor to set a unique threshold level for a type of a piezoelectric device used by the pressor sensor.

In addition, the configuration of the pressure sensor disclosed in the above patent publication may make it difficult to detect (i) Slow relax of the pressure applied to the piezoelectric device, i.e., a slow release of a user's finger that has pressed the pressable input portion from the pressable input portion (ii) An increase in the user's pressing force of the pressable input portion during the state of the pressable input portion being continuously held down From this viewpoint, the present disclosure aims to provide pressure sensors, each of which is capable of reliably detecting both a user's short press of a pressable input portion of the corresponding pressure sensor and the state of the pressable input portion being continuously held down by a user's long press of the pressable input portion.

The present disclosure additionally aims to provide pressure sensor devices, each of which is capable of reliably detecting, through a pressure sensor, both a user's short press of a pressable input portion of the pressure sensor and the state of the pressable input portion being continuously held down by a user's long press of the pressable input portion.

A first exemplary measure according to the present disclosure provides a pressure sensor. The pressure sensor includes a pressure sensing member having a pressable input surface that is deformable. The pressure sensing member is configured to generate an output voltage based on a deformation amount of the pressable input surface. The pressure sensor includes a controller. The controller is configured to (I) Sample a value of the output voltage as a first sampled value (II) Determine whether the first sampled value of the output voltage is higher than a predetermined first voltage threshold (III) Determine a start of a user's press on the pressable input surface upon determination that the first sampled value of the output voltage is higher than the first voltage threshold (IV) Sample, after determination of the start of the user's press on the pressable input surface, a value of the output voltage as a second sampled value (V) Determine whether one of a first condition and a second condition is satisfied to accordingly determine whether the user's press on the pressable input surface is terminated The first condition represents that the second sampled value of the output voltage is lower than a predetermined second voltage threshold, and the second condition representing that the output voltage has converged to a base voltage. The base voltage is a value of the output voltage of the pressure sensing member with no user's press on the pressable input surface of the pressure sensing member.

A second exemplary measure according to the present disclosure provides an optical information reader. The optical information reader includes a casing having a reading port and a pressable input surface that is deformable, and an imaging unit configured to perform an image capturing task of optically capturing an image of target information to be read through the reading port. The optical information reader includes a presser sensor including a pressure sensing member. The pressure sensing member is arranged to face the pressable input surface and configured to generate an output voltage based on a deformation amount of the pressable input surface. The optical information reader includes a controller configured to (I) Sample a value of the output voltage as a first sampled value (II) Determine whether the first sampled value of the output voltage is higher than a predetermined first voltage threshold (III) Determine a start of a user's press on the pressable input surface upon determination that the first sampled value of the output voltage is higher than the first voltage threshold (IV) Sample, after determination of the start of the user's press on the pressable input surface, a value of the output voltage as a second sampled value (V) Determine whether one of a first condition and a second condition is satisfied to accordingly determine whether the user's press on the pressable input surface is terminated The first condition represents that the second sampled value of the output voltage is lower than a predetermined second voltage threshold, and the second condition represents that the output voltage has converged to a base voltage. The base voltage is a value of the output voltage of the pressure sensing member with no user's press on the pressable input surface of the pressure sensing member.

The controller of each of the first and second exemplary measures therefore determines the start of a user's press on the pressable input surface in response to determination that the first sampled value of the output voltage is higher than the first voltage threshold. In addition, the controller of each of the first and second exemplary measures determines the termination of the user's press on the pressable input surface in response to determination that one of the following first and second conditions is satisfied:

The first condition represents that the second sampled value of the output voltage is lower than a predetermined second voltage threshold.

The second condition represents that the output voltage has converged to a base voltage.

The above configuration of the controller therefore makes it possible to determine the termination of a user's short press on the pressable input surface upon determination that the second sampled value of the output voltage is lower than the second voltage threshold after determination of the start of the user's press on the pressable input surface.

Similarly, even for a user's long press on the pressable input surface, the above configuration of the controller therefore makes it possible to determine the termination of the user's long press on the pressable input surface upon determination that the second sampled value of the output voltage is lower than the second voltage threshold after determination of the start of the user's press on the pressable input surface as long as the user's long pressing portion on the pressable input surface is released by a normal speed from the pressable input surface so that the output voltage becomes lower than the second voltage threshold due to the release of the user's long pressing portion from the pressable input surface.

Additionally, even if the user's long press on the pressable input surface is released more slowly so that the output voltage is maintained to be higher than or equal to the second voltage threshold, the above configuration of the controller makes it possible to determine the termination of the user's long press on the pressable input surface upon determination that the output voltage has converged to the base voltage based on change of the absolute difference of the output voltage from the base voltage.

In particular, because the output voltage of the pressure sensor slightly oscillates while the pressable input surface is continuously held down by the user's press on the pressable input surface, the output voltage of the pressure sensing member does not converge to the base voltage.

This therefore makes it possible to prevent erroneous determination that the termination of the user's press on the pressable input surface although the user's press on the pressable input surface has been continuous.

Consequently, the above configuration of the controller uses the pressure sensor to accurately determine either a user's short press or a user's long press on the pressable input surface.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENTS

Figure 1:
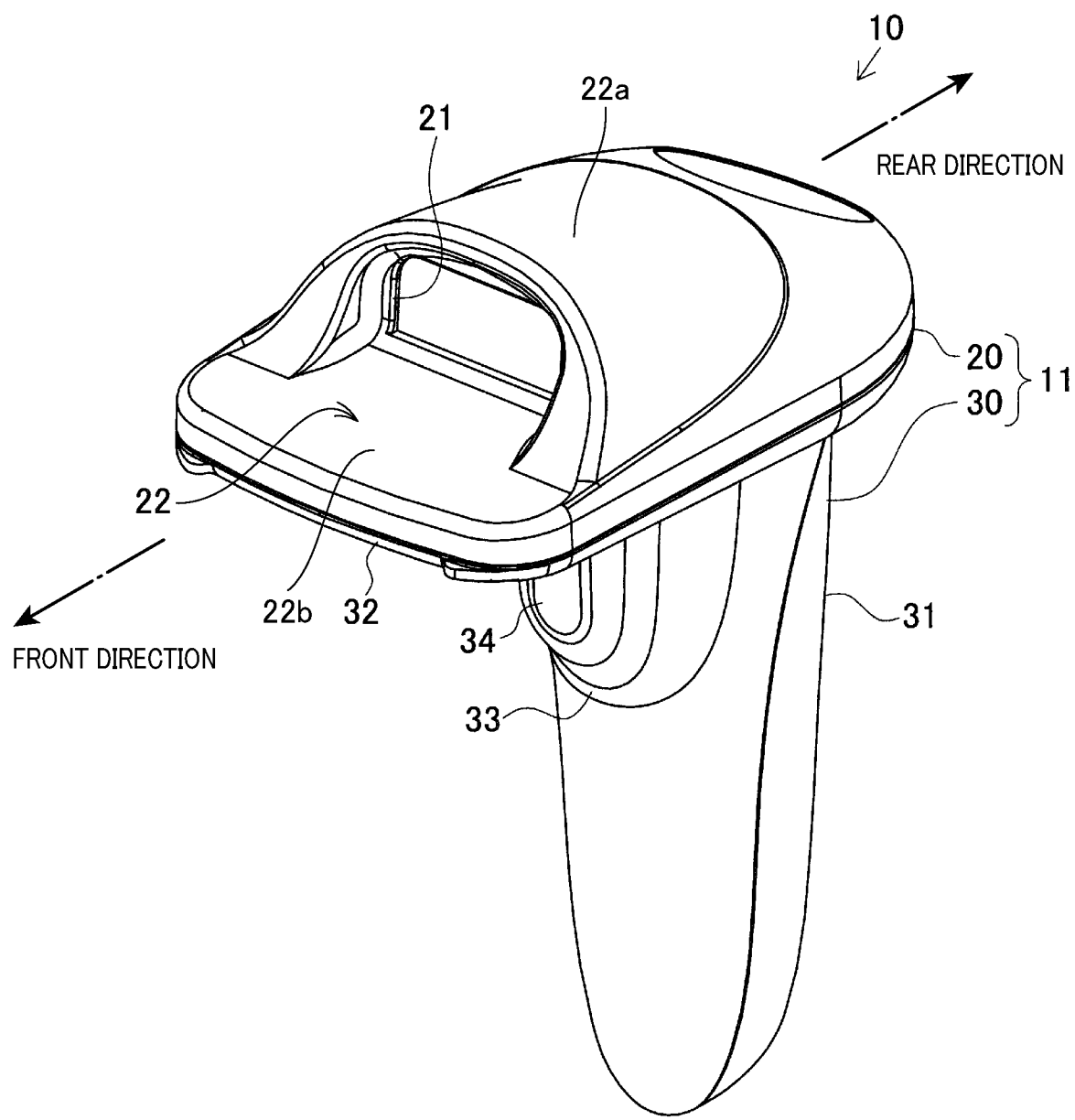
FIG. 1 is a perspective view of an optical information reader according to the first embodiment of the present disclosure.

The following describes exemplary embodiments of the present disclosure with reference to the accompanying drawings. In the exemplary embodiments, like parts between the embodiments, to which like reference characters are assigned, are omitted or simplified to avoid redundant description.

First Embodiment

The following describes an optical information reader 10 that embodies, as a first embodiment, the first and second exemplary measures of the present disclosure with reference to FIGS. 1 to 12.

An optical information reader 10 according to the first embodiment is designed as a handheld reader for optically reading optical information, such as information codes, for example, various types of data codes, such as barcodes or QR® codes.

Referring to FIGS. 1 to 4, the optical information reader 10 includes a case assembly, i.e., a casing, 11, and the case assembly 11 has a substantially L shape. When the L-shaped case assembly 11 of the optical information reader 10 is located as illustrated in FIG. 1, a longitudinal direction of the L-shaped case assembly 11 corresponds to the vertical direction in FIG. 1, and a lateral direction of the L-shaped case assembly 11 corresponds to the horizontal direction in FIG. 1.

One side of the lateral direction of the L-shaped case assembly 11 is defined as a front direction of the optical information reader 10, and the other side of the lateral direction of the L-shaped case assembly 11 is defined as a rear direction.

When the L-shaped case assembly 11 of the optical information reader 10 is arranged as illustrated in FIG. 1, a shorter portion of the L-shaped housing 11 located above a longer portion of the L-shaped case assembly 11 constitutes an upper case 20 of the L-shaped case assembly 11, and the longer portion of the L-shaped case assembly 11 located below the upper case 20 constitutes a lower case 30 of the case assembly 11.

Figure 2:
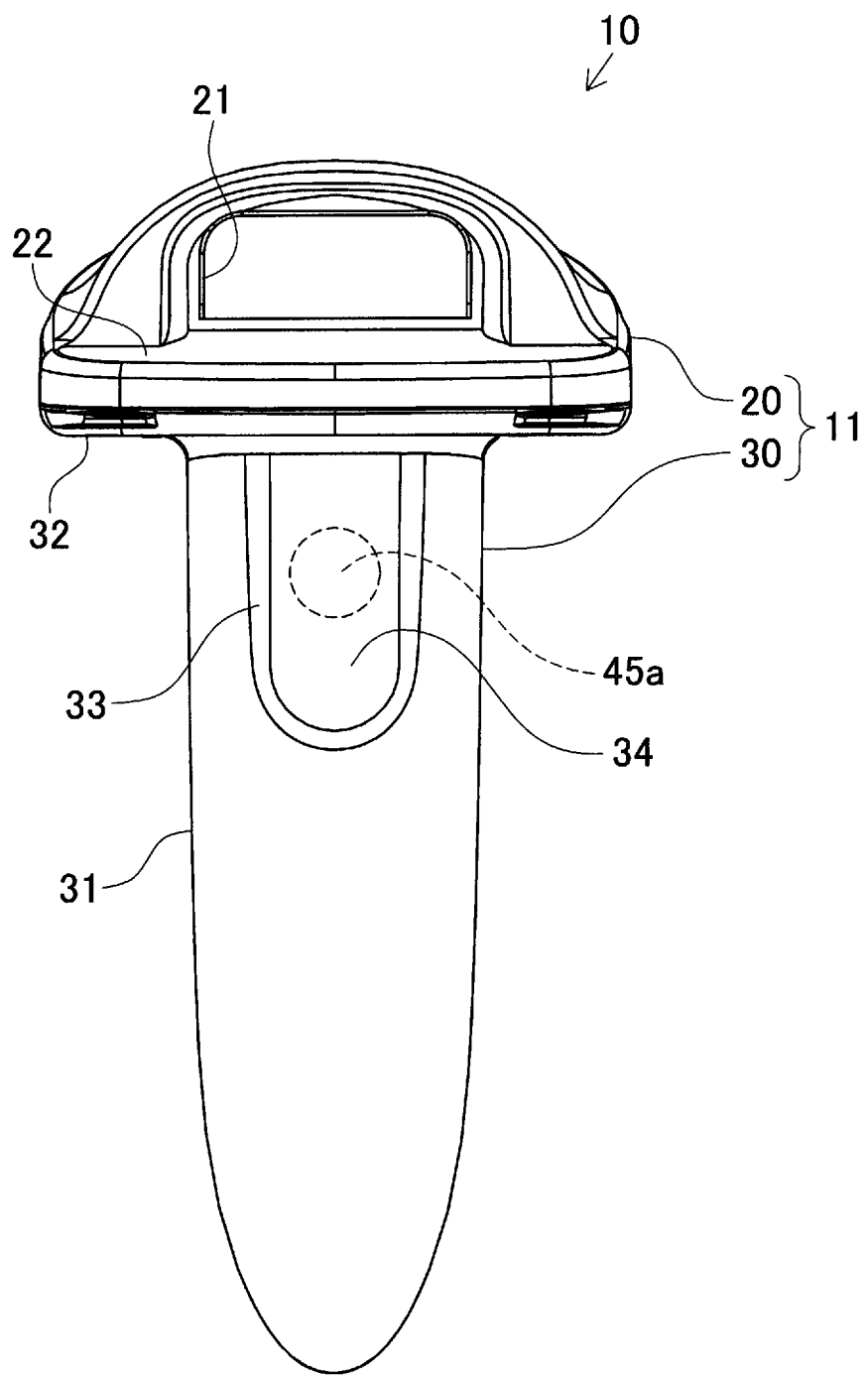
FIG. 2 is a plan view of the optical information reader illustrated in FIG. 1.
Figure 3:
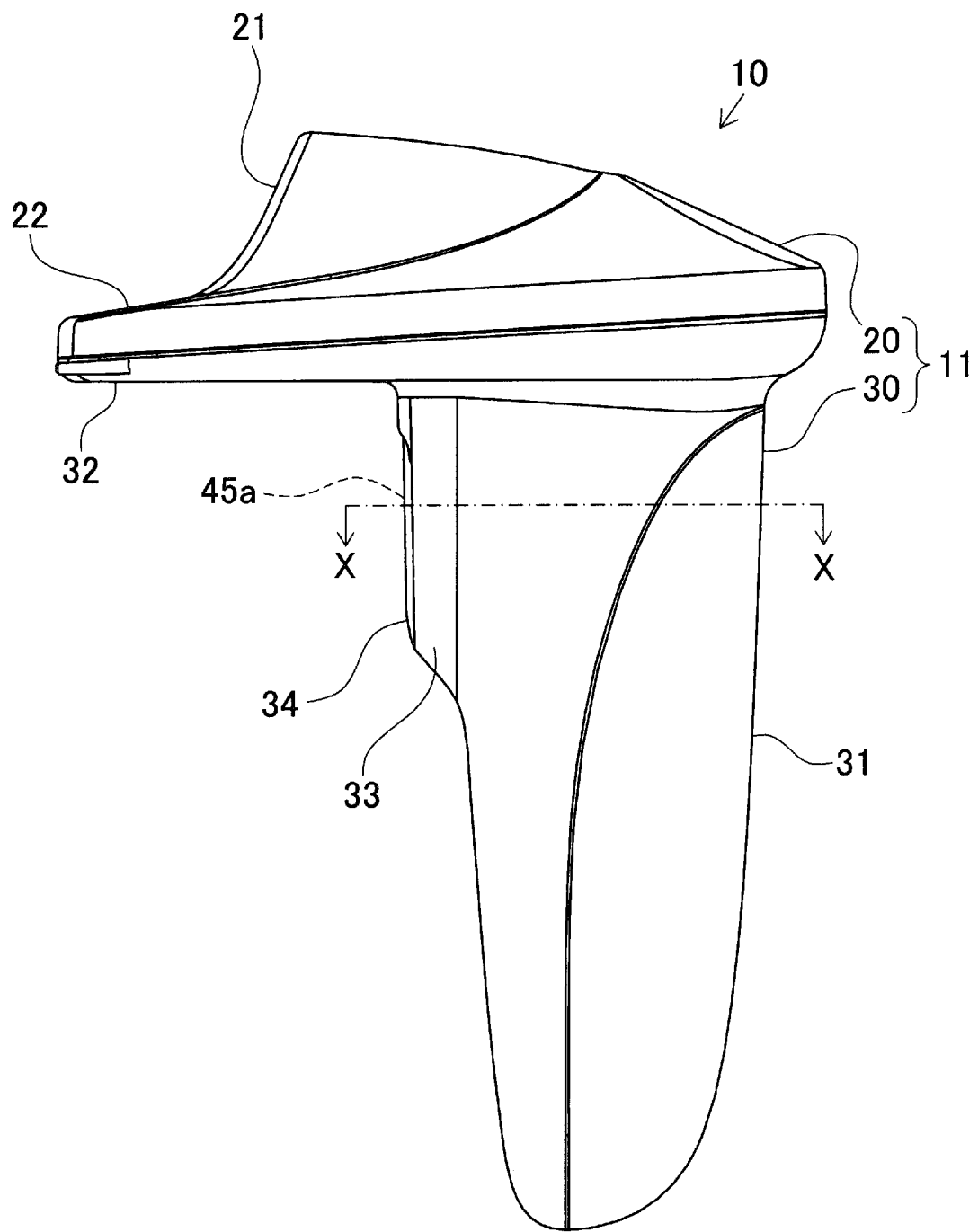
FIG. 3 is a side view of the optical information reader illustrated in FIG. 1.
Figure 4:
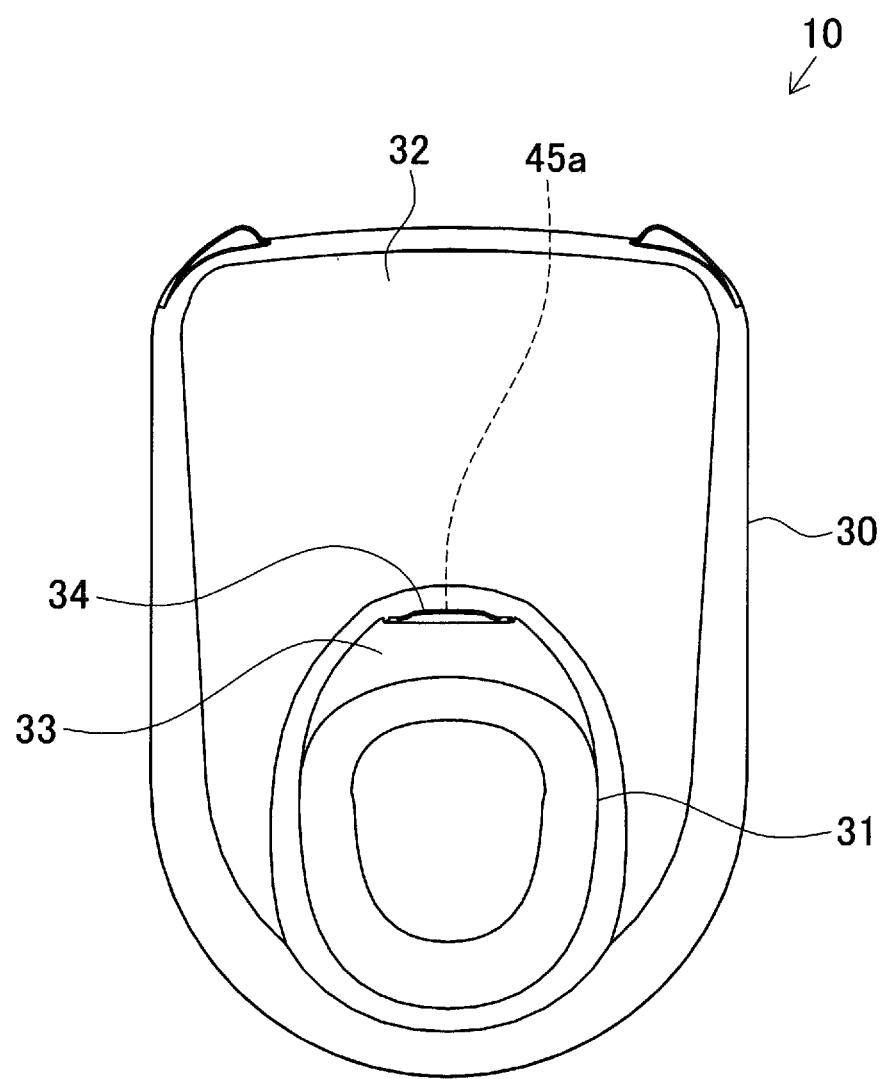
FIG. 4 is a bottom surface of the optical information reader illustrated in FIG. 1.

The upper case 20 has a rectangular plate-like hollow shape, and the lower case 30 is comprised of a bar-like hollow grip portion 31 and a rectangular plate-like hollow attachment 32. As illustrated in FIGS. 1 to 3, the attachment 32 enables the upper case 20 to be assembled to the grip portion 31 while (i) The longitudinal direction of the upper case 20 is substantially perpendicular to the longitudinal direction of the grip portion 31, so that the grip portion 31 extends in the longitudinal direction thereof from the upper case 20

(ii) The hollow space of the upper case 20 communicates with the hollow space of the grip portion 31 through the hollow space of the attachment 32, so that a component container chamber is defined in the case assembly 11

The upper case 22 has an upper wall, a center 22a of which is protruded upwardly to constitute a reading-port portion 22a. The reading-port portion 22a has an end wall that faces toward the front direction, and the end wall of the reading-port portion 22a has an opening or a light transmissive portion serving as a reading port 21. The reading port 21 enables light to pass therethrough.

The remaining portion of the upper wall of the upper case 22 surrounds the reading-port portion 22a as a surrounding portion, and an upper surface 22b of a part of the surrounding portion, which extends in front of the reading port 21, serves as a guide 22b for guiding light entering through the reading port 21 the inside of the housing 11 or light outputted externally therethrough from the inside of the housing 11. The upper surface of the upper wall of the upper case 22 extends in perpendicular to the extending direction of the grip portion 31.

The upper case 22 has a bottom wall that defines an opening thereinside, and the attachment 32 is mounted to the bottom wall of the upper case 22, and the attachment 32 has a bottom wall with an opening at a rear end thereof.

The grip portion 31 has a first end that defines an opening thereinside, and a second end opposite to the first end. The first end of the grip portion 31 is joined to the periphery of the opening of the rear end of the attachment 32.

The grip portion 31 has flat outer sides without projections and depressions. This enables disinfectant wiping of the outer sides of the grip portion 31 to be easily carried out. The joined portion of the grip portion 31 to the rear end of the attachment 32 has a smoothly curved shape from the grip portion 31 to the attachment 32. This also enables disinfectant wiping of the joined portion of the grip portion 31 to the rear end of the attachment 32 to be easily carried out.

The outer sides of the grip portion 31 include a front side 31a of a front wall 310 thereof, and a portion 33 of the front side 31a, which is located below the guide 22, protrudes smoothly from the remaining portion of the front side 31a; the protruding portion 33 serves as a user-interface portion 33. The user-interface portion 33 has a front wall 340 that has a flat front surface serving as a pressable input surface 34 that is deformable. When touched, i.e., pressed, by a finger of a user for instructing the optical information reader 10 to read a target information code, the pressable input surface 34 is deformed based on pressure applied to the pressable input surface 34.

Note that users who use the optical information reader 10 can include humans and robots.

The user-interface portion 33 is comprised of the front wall 340 and a side wall portion 341 continuously joined thereto and to the front wall 310 of the grip portion 31. The front wall 340 of the user-interface portion 33 has a thickness t that is thinner than a thickness of the side wall portion 341 of the user-interface portion 33, which enables the pressable input surface 34 to be easily deformed. For example, if the thickness of the side wall portion 341 of the user-interface portion 33 is set to 1.5 mm to 2.0 mm, the thickness t of the front wall 340 of the user-interface portion 33 is set to be within the range from 0.7 mm to 1.5 mm inclusive.

The optical information reader 10 includes an electro-optics circuit 10a installed in the component container chamber defined in the case assembly 11 of the optical information reader 10.

Figure 5:
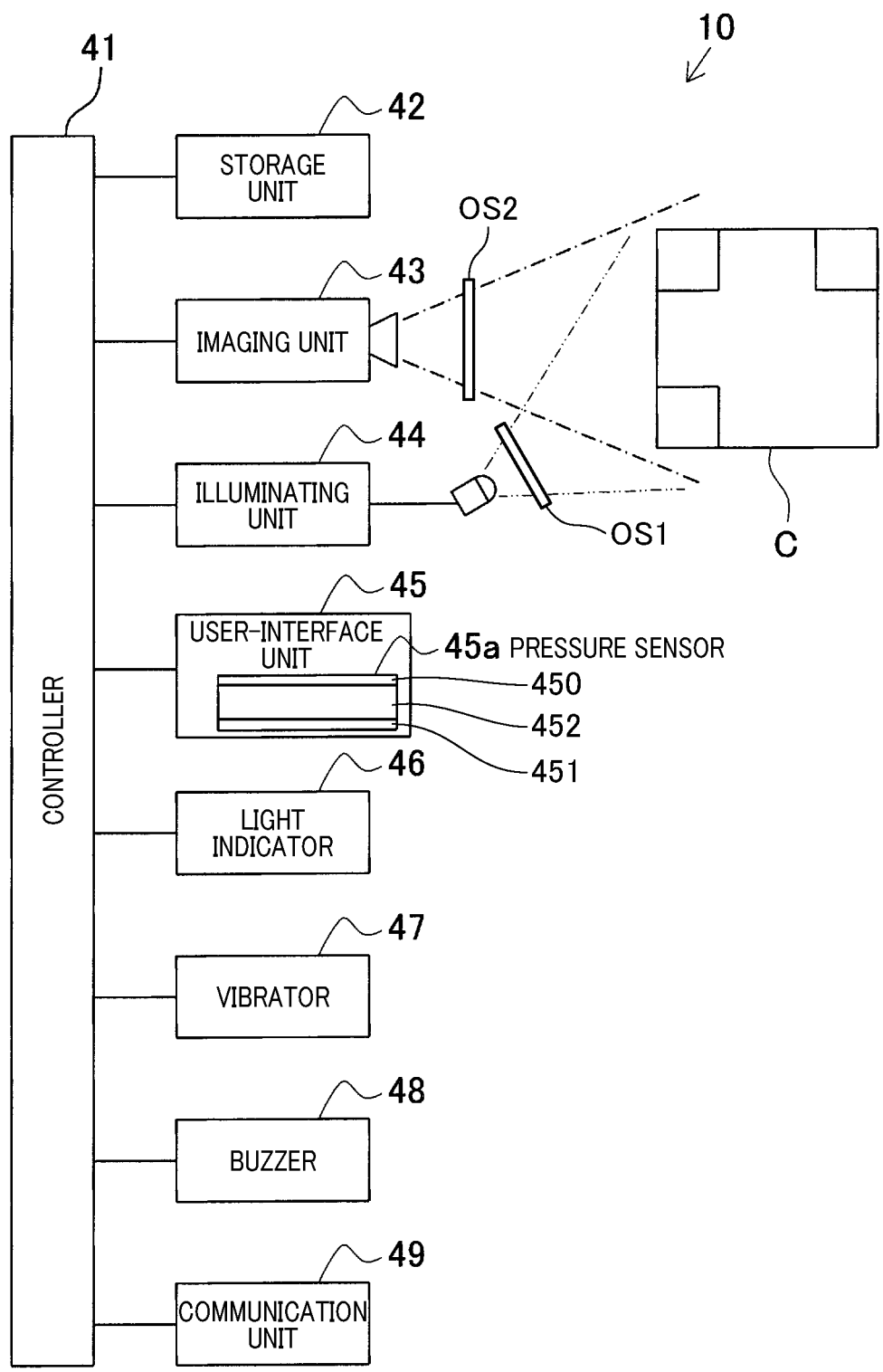
FIG. 5 is a block diagram schematically illustrating an electric circuit configuration of the optical information reader illustrated in FIG. 1.

Referring to FIG. 5, the electro-optics circuit 10a of the optical information reader 10 is comprised of a controller 41, a storage unit 42, an imaging unit 43, an illuminating unit 44, a light illumination optical system OS1, a light receiving optical system OS2, a user-interface unit 45, a light indicator 46, a vibrator 47, a buzzer 48, and a communication unit 49.

The controller 41 is comprised of, for example, at least one CPU, and the storage unit 42 is comprised of a ROM, a RAM, and/or a nonvolatile memory. The controller 41 is configured to runs program instructions stored in the storage unit 42 to thereby control the above components 43 to 49.

The illuminating unit 44 is configured to emit illumination light. The illuminating unit 44 and the light illumination optical system OS1 are arranged to cause the emitted illumination light, which has been subjected to an optical process by the light illumination optical system OS1, to move through the reading port 21 in the front direction.

The imaging unit 43 is designed as, for example, a camera device comprised of a light receiving sensor, such as a CMOS area sensor or a CCD area sensor. The light receiving sensor is comprised of two-dimensionally arranged light receiving elements, such as pixels; these light receiving elements (pixels) constitute a light receiving area. The imaging unit 43 and the light receiving optical system OS2 are arranged to cause light, which has entered the inside of the case assembly 11 through the reading port 21 and thereafter has been subjected to an optical process by the light receiving optical system OS2, to be imaged on the light receiving area of the light receiving sensor.

The light indicator 46 is comprised of, for example, a light emitting device (LED) for emitting light under control of the controller 41. The vibrator 47 is configured to generate vibrations under control of the controller 41; the vibration is transmittable to a user who grips the grip portion 31. The buzzer 48 is configured to generate a buzzing sound, such as beeping tones or alarm tones, under control of the controller 41.

The communication unit 49 is configured to perform radio communications with one or more external devices; the one or more external devices include a higher-order device or a holder, such as a cradle, for holding the optical information reader 10.

In particular, the illuminating unit 44 and the light illumination optical system OS1 are arranged in the upper case 20 to cause the illumination light emitted from the illuminating unit 44 to illuminate, through the reading port 21, a predetermined field of view defined with respect to the optical information reader 10. The imaging unit 43 and the light receiving optical system OS2 are arranged in the upper case 20 to enable the imaging unit 43 to generate an image of a predetermined imaging region defined with respect to the optical information reader 10; the field of view and the imaging region defined with respect to the optical information reader 10 substantially match each other.

The user-interface unit 45 includes a pressure sensor 45a comprised of a piezoelectric device. The pressure sensor 45a is arranged to generate a voltage based on a deformation amount of the pressable input surface 34. Specifically, the pressure sensor 45a, the piezoelectric device, is comprised of a pair of first and second electrodes 450 and 451 and a piezoelectric body 452 located between the pair of first and second electrodes 450 and 451.

Figure 6:
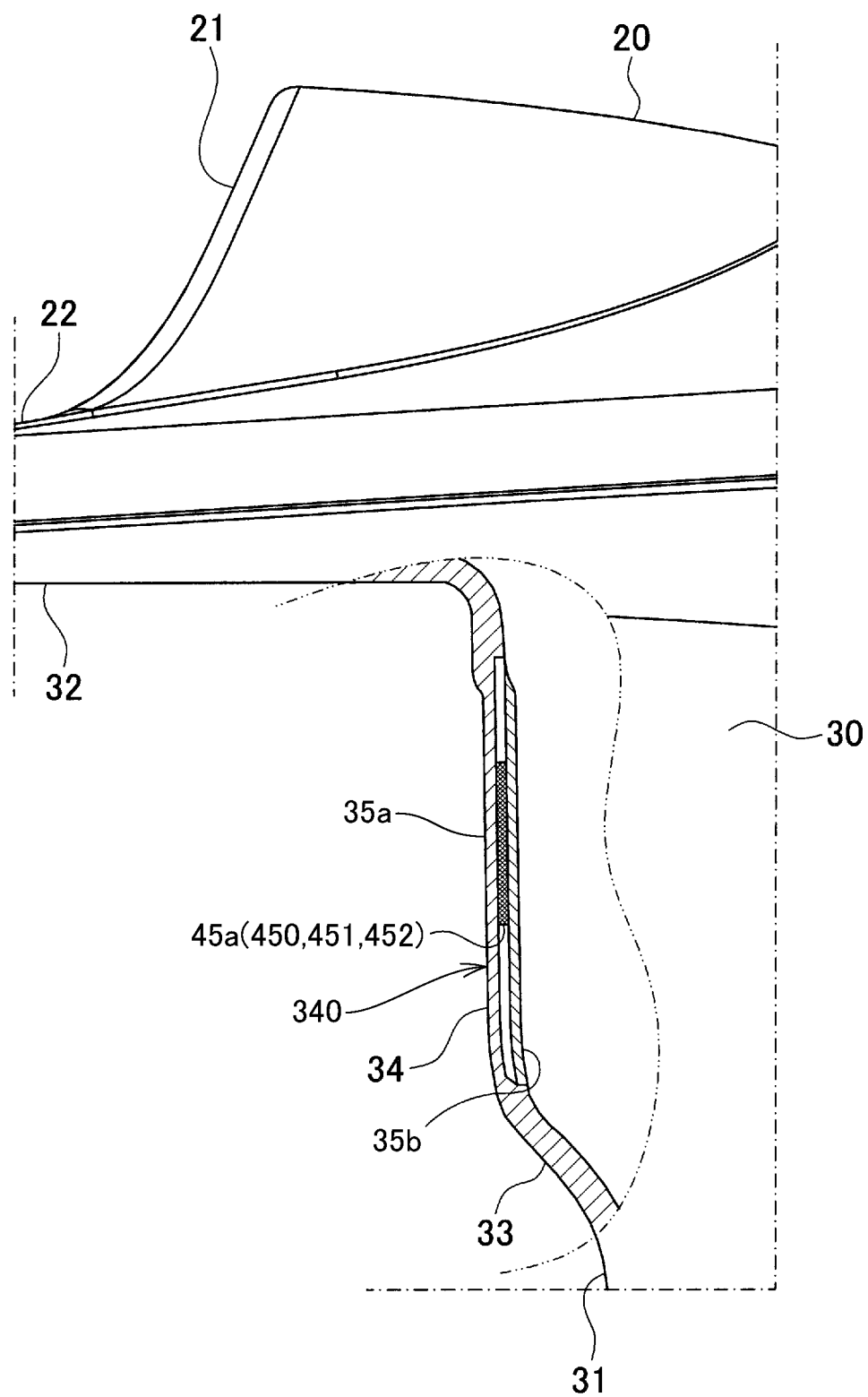
FIG. 6 is a partially enlarged view of the optical information reader illustrated in FIG. 1, which illustrates an arrangement of a pressure sensor.

As illustrated in FIG. 6, the pressure sensor 45a is mounted to the front wall 340 of the user-interface portion 33 such that the first electrode 450 faces the pressable input surface 34 of the user-interface portion 33. That is, the front wall 340 includes a first wall portion 35a interposed between the pressable input surface 34 and the pressure sensor 45a, and a second wall portion 35b, such as a plate-like support portion, 35 located at the rear side of the pressure sensor 45a, so that the pressure sensor 45a is sandwiched between the first and second wall portions 35a and 35b of the front wall 340. For example, the second wall portion 35b can be configured as a plate-like or tape-like member, and the pressure sensor 45a mounted on the first wall portion 35a can be secured thereto by the plate-like or tape-like member 35b.

Deformation of the pressable input surface 34 causes the piezoelectric body 452 of the pressure sensor 45a to be deformed, so that the pressure sensor 45a generates, to the controller 41, a voltage based on the deformation amount of the piezoelectric body 452, i.e., the deformation amount of the pressable input surface 34.

Figure 7A:
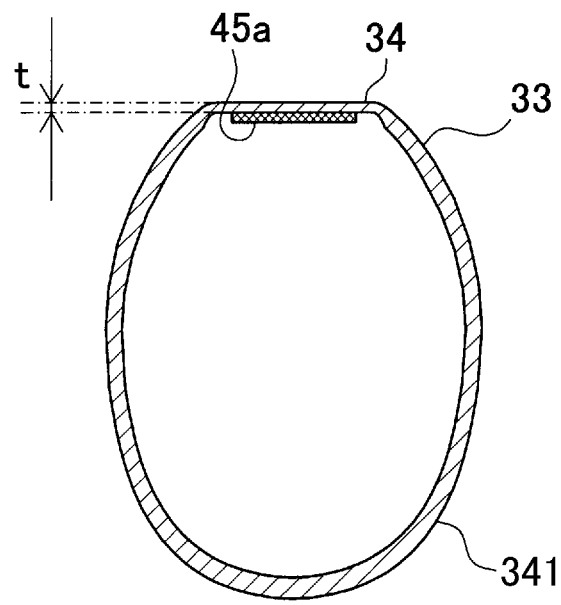
FIG. 7A is a schematic cross-sectional view illustrating a state where a pressable input surface of the optical information reader is not pressed.

Specifically, as illustrated in FIG. 7A, if a user does not touch the pressable input surface 34, a predetermined constant base voltage Vo is outputted from the pressure sensor 45a to the controller 41.

In contrast, if a user touches the pressable input surface 34 with a finger by pressing force F, the pressable input surface 34 is deformed, i.e., the piezoelectric body 452 is deformed, based on the pressing force F, so that a voltage based on the deformation amount of the piezoelectric body 452, i.e., the deformation amount of the pressable input surface 34, is outputted from the pressure sensor 45a to the controller 41.

Figure 7B:
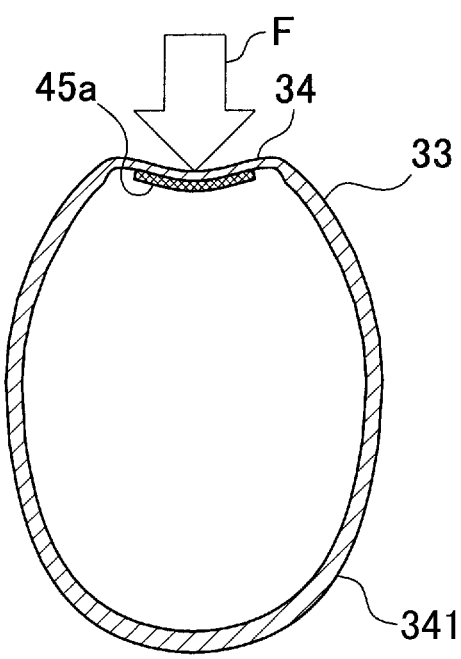
FIG. 7B is a schematic cross-sectional view illustrating a state where the pressable input surface of the optical information reader is pressed.
Figure 8:
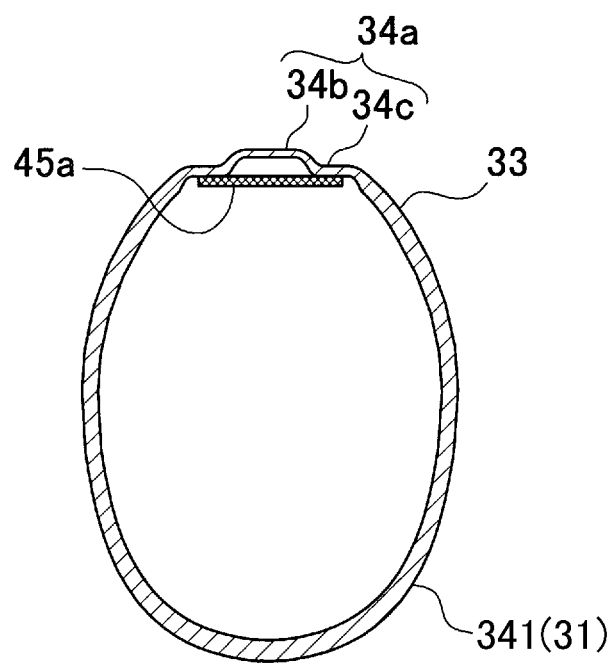
FIG. 8 is a schematic cross-sectional view illustrating a state where a modified pressable input surface of the optical information reader is not pressed.

The configuration of the pressure sensor 45a is an example, and therefore one of the various configurations of the pressure sensor 45a can be employed. As another example, a modified pressable input surface 34a can be employed in place of the pressable input surface 34. Specifically, as illustrated in FIG. 8, the pressable input surface 34a is comprised of a peripheral edge portion 34c and a center portion 34b surrounded by the peripheral edge portion 34c; the center portion 34b protrudes outwardly in the front direction with respect to the peripheral edge portion 34c. Note that, in each of FIGS. 7A, 7B, and 8, illustration of some components installed in the grip portion 31 is omitted except for the pressure sensor 45a.

The controller 41 is programmed to perform a pressing determination routine in accordance with a voltage inputted from the pressure sensor 45a of the user-interface unit 45.

The controller 41 is programmed to perform an information reading routine in response to, for example, determination by the pressing determination routine that there is a user's finger touch, i.e., press, on the pressable input surface 34 while a target information code C (see FIG. 5) is located within the field of view of the optical information reader 10; the field of view of the optical information reader 10 matches the imaging region of the imaging unit 43.

Specifically, the information reading routine performs an image capturing task of instructing (i) the imaging unit 44 to illuminate, with illumination light, the field of view within which the target information code C is located, and (ii) the imaging unit 43 to capture one or more images of the target information code C based on reflection light that results from reflection of the illumination light by the target information code C and is focused on the light receiving area of the imaging unit 43.

Then, the information reading routine performs a decoding task of decoding information, i.e., data, coded in the target information code C included in each of the captured images using known one or more reading methods.

The controller 41 is configured to perform a data transmission routine of transmitting the decoded data about the target information code C to the one or more external devices at a desired time based on radio communications of the communication unit 49. The communication unit 49 serves as an example of a radio communication unit for performing radio communications with the one or more external devices.

Next, the following describes the pressing determination routine carried out by the controller 41 in accordance with a voltage inputted from the pressure sensor 45a of the user-interface unit 45 with reference to FIGS. 9A to 11.

As described above, a user's finger press on the pressable input surface 34 causes the pressable input surface 34 to be deformed, resulting in the piezoelectric body 452 being deformed. Deformation of the pressable input surface 34, i.e., deformation of the piezoelectric body 452, causes a voltage, which will be referred to as an output voltage V, of the pressure sensor 45a to change to be higher than the base voltage Vo. Thereafter, release of the user's finger from the pressable input surface 34 causes the output voltage V of the pressure sensor 45a to change to be lower than the base voltage Vo due to spring back of the pressable input surface 34. The spring back of the pressable input surface 34 is caused as an opposite reaction for the user's pressing action of the pressable input surface 34.

A user's short touch, i.e., a user's short press, of the pressable input surface 34 may cause the above voltage change to occur. Similarly, a user's long touch, i.e., a user's long press, of the pressable input surface 34, which results in the pressable input surface 34 being continuously held down, may also cause the above voltage change to occur.

Figure 9A:
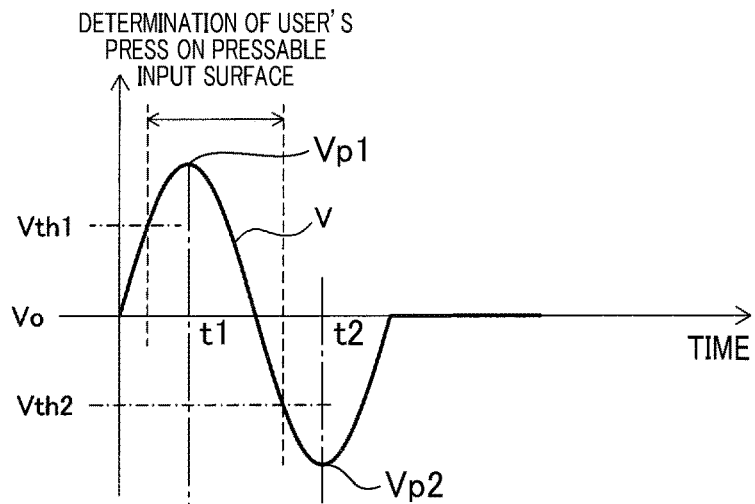
FIG. 9A is a graph schematically illustrating how an output voltage of the pressure sensor, which is caused by a user's short press of the pressable input surface, changes over time.

FIG. 9A schematically illustrates how the output voltage V of the pressure sensor 45a, which is caused by a user's short press of the pressable input surface 34, changes over time.

Specifically, the output voltage V of the pressure sensor 45a increases from the base voltage Vo due to the start of a user's press on the pressable input surface 34 up to a highest peak Vp1 at time t1, thereafter decreases so as to be below the base voltage Vo caused by the spring back and down to a lowest peak Vp2 at time t2 due to release of the user's touch on the pressable input surface 34, and thereafter increases to have converged to the base voltage Vo.

In accordance with the change of the output voltage V of the pressure sensor 45a caused by a user's short press on the pressable input surface 34, the controller 41 is configured to set (I) A first voltage threshold Vth1 to be higher than the base voltage Vo and lower than the highest peak Vp1

(II) A second voltage threshold Vth2 to be lower than the base voltage Vo and higher than the lowest peak Vp2

This configuration makes it possible to determine that a user's press on the pressable input surface 34 has been started upon determination that the output voltage V has exceeded the first voltage threshold Vth1. This configuration also makes it possible to determine that the user's press on the pressable input surface 34 has been terminated upon determination that the output voltage V has decreased below the second voltage threshold Vth2. The second voltage threshold Vth2 can be set to be higher than, equal to, or lower than the first voltage threshold Vth1.

Figure 9B:
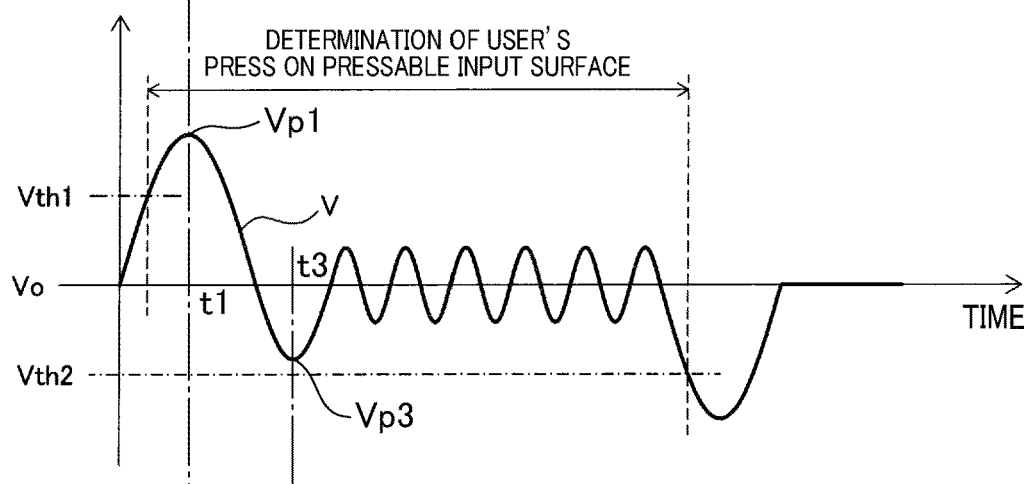
FIG. 9B is a graph schematically illustrating how the output voltage of the pressure sensor, which is caused by a user's long press on the pressable input surface, changes over time.

FIG. 9B schematically illustrates how the output voltage V of the pressure sensor 45a, which is caused by a user's long press on the pressable input surface 34, changes over time.

Specifically, the output voltage V of the pressure sensor 45a increases from the base voltage Vo due to the start of a user's press on the pressable input surface 34 up to a highest peak Vp1 at time t1 and thereafter decreases so as to be below the base voltage Vo caused by the spring back. At that time, because the state of the pressable input surface 34 being continuously held down is maintained, the output voltage V of the pressure sensor 45a has decreased down to a value Vp3 higher than the lowest peak Vp2 at time t3.

After the time t3, because the pressable input surface 34 is continuously held down, the slight vibrations of the pressing finger muscles cause the output voltage V of the pressure sensor 45a to slightly vary alternately over and below the base voltage Vo without increasing over the first voltage threshold Vth1 and decreasing below the second voltage threshold Vth2. This is because the amplitudes of the oscillation or variation of the output voltage V of the pressure sensor 45a due to the vibrations of the pressing finger muscles are smaller than those of the highest and lowest peaks Vp1 and Vp2.

Thereafter, release of the user's pressing finger from the pressable input surface 34 causes the output voltage V to have decreased below the second voltage threshold Vth2 down to the lowest peak Vp2, making it possible to determine that the user's press on the pressable input surface 34 has been terminated.

Note that another cause that causes the output voltage V of the pressure sensor 45a to oscillate alternately over and below the base voltage Vo is pyroelectric effect where the positive and negative charges in the piezoelectric body 452 are moved due to the difference in temperature between the user's pressing finger and the first electrode side of the piezoelectric body 452, resulting in slight oscillation of the output voltage V set forth above.

Figure 9C:
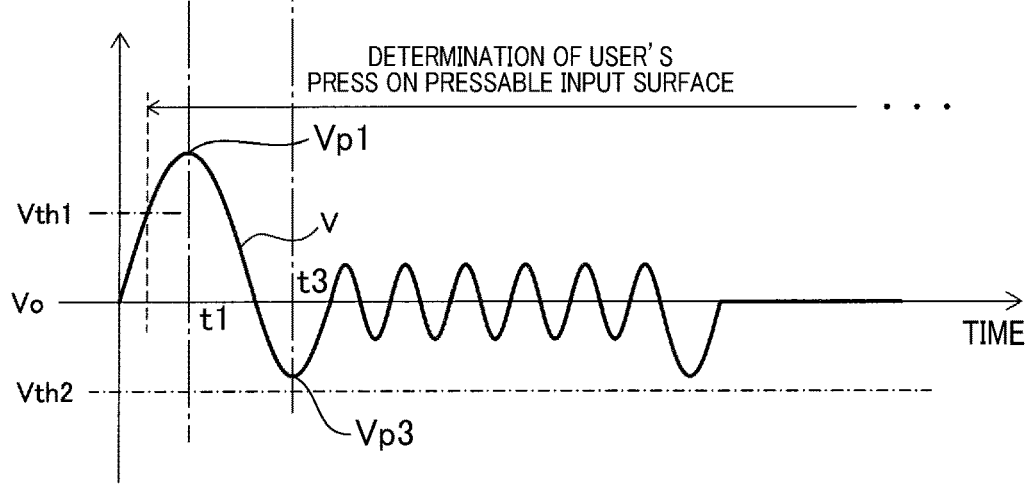
FIG. 9C is a graph schematically illustrating how the output voltage of the pressure sensor, which is caused by a user's long finger press on the pressable input surface and the user's pressing finger is released more slowly as compared with the case of FIG. 9B, changes over time.

In contrast, if the user releases the pressing finger from the pressable input surface 34 more slowly, the output voltage V of the pressure sensor 45a may not decrease below the second voltage threshold Vth2 as illustrated in FIG. 9C other than FIG. 9B. This may make it difficult for the controller 41 to determine whether the user's press on the pressable input surface 34 is terminated. Because the controller 41, which has determined a user's press on the pressable input surface 34 has started, may not determine the termination of the user's press on the of the pressable input surface 34, the controller 41 may not start the information reading routine.

From the above viewpoint, the controller 41 is configured to determine whether the output voltage V has converged to the base voltage Vo based on change of the absolute difference of the output voltage V from the base voltage Vo to accordingly determine whether the user's press on the pressable input surface is terminated.

As an exemplary specific measure, the controller 41 uses a previously prepared third voltage threshold Vth3. The third voltage threshold Vth3 is previously determined as a voltage level relative to the base voltage Vo such that, when it is assumed that a user's finger is touching the pressable input surface 34, a first period P1 for which the absolute difference between the output voltage V of the pressure sensor 45a and the base voltage Vo is higher than the third voltage threshold Vth3 and a second period P2 for which the absolute difference between the output voltage V of the pressure sensor 45a and the base voltage Vo is lower than the third voltage threshold Vth3 appear alternately (see FIG. 10).

Specifically, an amplitude value of the output voltage V of the pressure sensor 45a was measured for each of a predetermined number of sample users, i.e., many sample users, while the corresponding sample user was touching the pressable input surface 39, and an average of the measured amplitude values of the many sample users was calculated as a predetermined reference standard voltage. Thereafter, the third voltage threshold Vth3, which is slightly lower than the reference standard voltage by a predetermined value, was determined.

The controller 41 is programmed to perform the pressing determination routine using the third voltage threshold Vth3.

Figure 10:
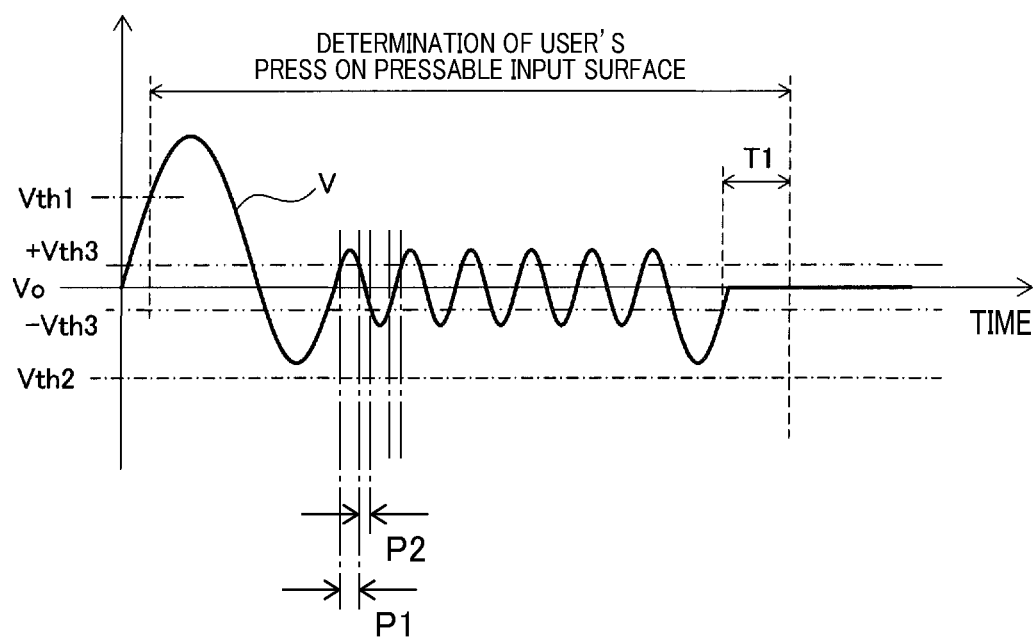
FIG. 10 is a graph schematically illustrating how a controller of the optical information reader determines the termination of the user's long finger press on the pressable input surface according to the first embodiment.

Specifically, the controller 41 is programmed to
(I) Determine whether a state where the absolute difference of the output voltage V of the pressure sensor 45a from the base voltage Vo is lower than or equal to the third voltage threshold Vth3 has been continuous at least for a predetermined time threshold T1 after determination of the start of a user's press on the pressable input surface 34
(II) Determine that the user's touch on the pressable input surface 34 is terminated upon determination that the state where the absolute difference of the output voltage V of the pressure sensor 45a from the base voltage Vo is lower than or equal to the third voltage threshold Vth3 has been continuous at least for the predetermined time threshold T1 (see FIG. 10)

That is, as illustrated in FIG. 10, when determining that the absolute difference of the output voltage V of the pressure sensor 45a from the base voltage Vo is lower than or equal to the third voltage threshold Vth3 has been continuous at least for the predetermined time threshold T1, the controller 41 makes it possible to determine that the output voltage V has converged to the base voltage Vo based on change of the absolute difference of the output voltage V from the base voltage Vo. This therefore enables the controller 41 to determine that the user's press on the pressable input surface is terminated.

Figure 11:
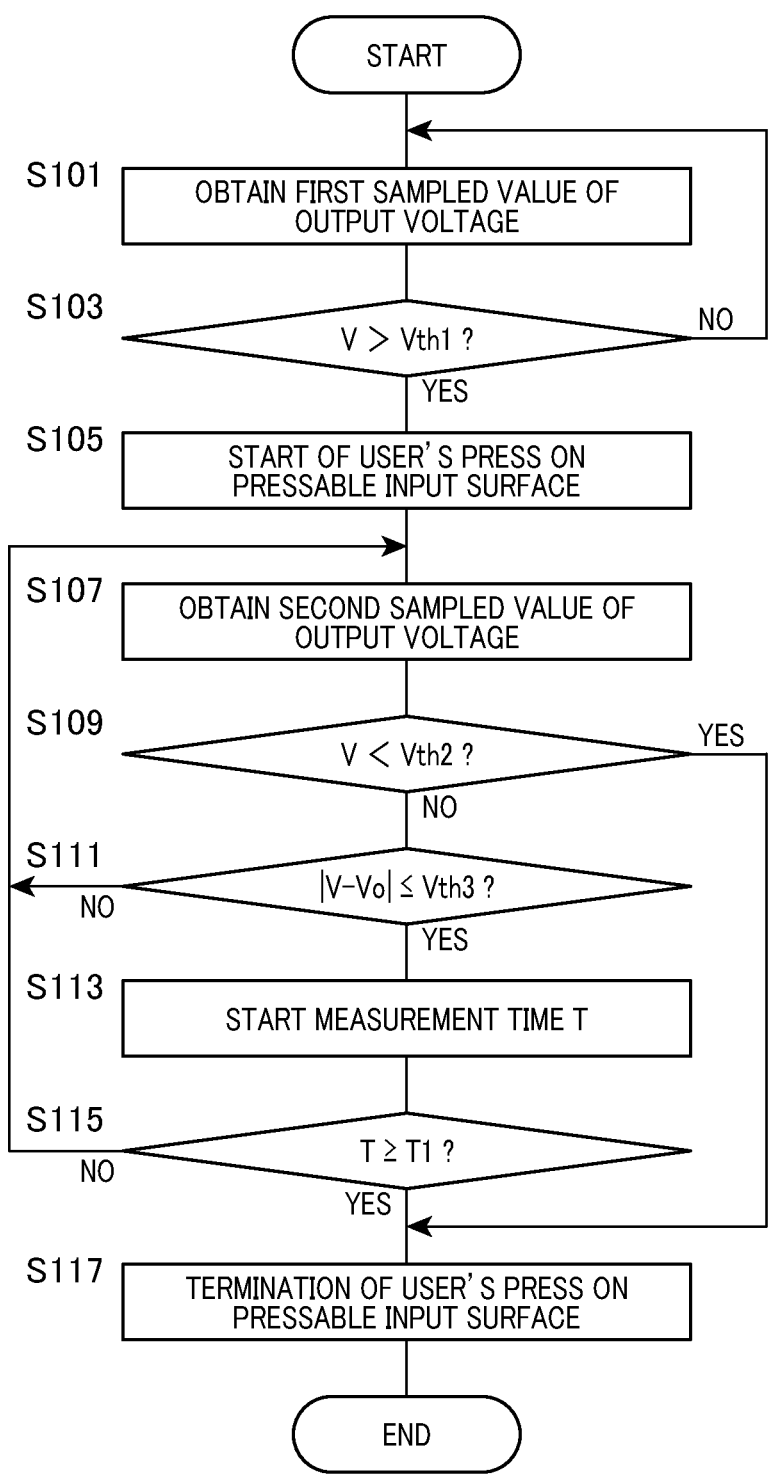
FIG. 11 is a flowchart schematically illustrating a pressing determination routine carried out by the controller.
Figure 12:
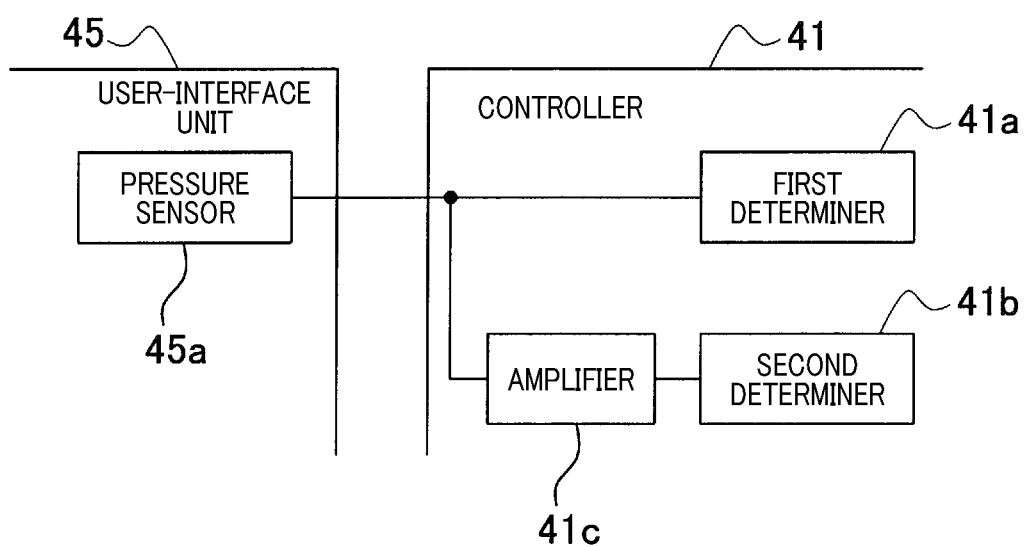
FIG. 12 is a block diagram schematically illustrating selected components of focus included in the optical information reader according to a modification of the first embodiment.

Next, the following describes specific operations of the pressing determination routine carried out by the controller 41 with reference to FIG. 11.

When starting the pressing determination routine, the controller 41 samples, as a first sampled value, a value of the output voltage V of the pressure sensor 45a in step S101 of FIG. 11, and determines whether the first sampled value of the output voltage V is higher than the first voltage threshold Vth1 in step S103.

At that time, upon determination that the first sampled value of the output voltage V is lower than or equal to the first voltage threshold Vth1 (NO in step S103), the controller 41 determines that the output voltage V is maintained to be lower than or equal to the first voltage threshold Vth1, and therefore determines no user's press on the pressable input surface 34, repeating the operations in steps S101 and S103.

Otherwise, upon determination that the first sampled value of the output voltage V is higher than the first voltage threshold Vth1 (YES in step S103), the controller 41 determines that the output voltage V has increased over the first voltage threshold Vth1 due to a user's finger touch (press) on the pressable input surface 34, thus determining the start of a user's touch (press) on the pressable input surface 34 in step S105.

Then, the controller 41 samples a value of the output voltage V of the pressure sensor 45a as a second sampled value in step S107, and determines whether the second sampled value of the output voltage V is lower than the second voltage threshold Vth2 in step S109.

At that time, upon determination that the second sampled value of the output voltage V is higher than or equal to the second voltage threshold Vth2 (NO in step S109), the controller 41 determines that the output voltage V has been maintained to be higher than or equal to the second voltage threshold Vth2 due to the continuation of the user's finger press on the pressable input surface 34.

In response to the negative determination in step S109, the pressing determination routine proceeds to step S111.

In step S111, the controller 41 determines whether the absolute difference of the output voltage V of the pressure sensor 45a from the base voltage Vo is lower than or equal to the third voltage threshold Vth3.

Upon determination that the absolute difference of the output voltage V of the pressure sensor 45a from the base voltage Vo is higher than the third voltage threshold Vth3 (NO in step S111), the controller 41 determines the state of the output voltage V oscillating alternately, and therefore determines that the user's press on the pressable input surface 34 has been continuous. Then, the controller 41 repeats the operations in steps S107, S109, and S111 until the determination in step S111 is affirmative.

During the repeat of a sequence of the operations in steps S107, S109, and S111, upon determination that the output voltage V is lower than the second voltage threshold Vth2 due to release of the user's finger from the pressable input surface 34 in a currently executing sequence (YES in step S109), the controller 41 determines that the user's finger press on the pressable input surface 34 is cancelled in step S117. The completion of the operation in step S117 terminates the pressing determination routine.

Otherwise, during the repeat of the sequence of the operations in steps S107, S109, and S111, upon determination that the absolute difference of the output voltage V of the pressure sensor 45a from the base voltage Vo is lower than or equal to the third voltage threshold Vth3 in a currently executing sequence (YES in step S111), the controller 41 starts to measure, from an initial value of 0, a time T for which the state where the absolute difference of the output voltage V of the pressure sensor 45a from the base voltage Vo is lower than or equal to the third voltage threshold Vth3 has been continuous in step S113.

Following operation in step S113, the controller 41 determines whether the measured time T is greater than or equal to the predetermined time threshold T1 in step S115.

Upon determination that the measured time T is smaller than the predetermined time threshold T1, that is, the time T for which the state where the absolute difference of the output voltage V of the pressure sensor 45a from the base voltage Vo is lower than or equal to the third voltage threshold Vth3 has not continued for the predetermined time threshold T1 (NO in step S115), the controller 41 repeats a sequence of the operations in steps S107, S109, S111, S113, and S115 until the determination in step S115 is affirmative.

If the determination in step S111 is NO, i.e., the absolute difference between the output voltage V of the pressure sensor 45a from the base voltage Vo is determined to be higher than the third voltage threshold Vth3 (NO in step S111) in a current sequence of the operations in steps S107, S109, S111, S113, and S115, the controller 41 clears the measured time to the initial value of 0, and starts to measure, from the initial value of 0, the time T in step S113 of the next sequence of the operations in steps S107, S109, S111, S113, and S115.

During the repeat of the sequence of the operations in steps S107, S109, S111, S113, and S115 upon determination that the measured time T is greater than or equal to the predetermined time threshold T1 (YES in step S115), the controller 41 determines slower release of the user's finger from the pressable input surface 34, thus determining that the user's long finger press on the pressable input surface 34 is cancelled in step S117. The completion of the operation in step S117 terminates the pressing determination routine.

Specifically, the controller 41 is configured to perform the pressing determination routine according to the first embodiment to thereby determine the start of a user's press on the pressable input surface 34 in response to determination that a first sampled value of the output voltage V is higher than the first voltage threshold Vth1.

In addition, the controller 41 is configured to determine the termination of the started user's press on the pressable input surface 34 in response to determination that one of the following first and second conditions is satisfied:

The first condition represents that a second sampled value of the output voltage V is lower than the second voltage threshold Vth2 after determination of the start of the user's finger press on the pressable input surface 34 (see step S109).

The second condition represents that the state where the absolute difference of the output voltage V of the pressure sensor 45a from the base voltage Vo is lower than or equal to the third voltage threshold Vth3 has been continuous at least for the predetermined time threshold T1 (see step S115).

This configuration of the controller 41 therefore makes it possible to determine the termination of a user's short press on the pressable input surface 34 upon determination that the second sampled value of the output voltage Vis lower than the second voltage threshold Vth2 after determination of the start of the user's press on the pressable input surface 34.

Similarly, even for a user's long press on the pressable input surface 34, the above configuration of the controller 41 therefore makes it possible to determine the termination of the user's long press on the pressable input surface 34 upon determination that the second sampled value of the output voltage Vis lower than the second voltage threshold Vth2 after determination of the start of the user's press on the pressable input surface 34 as long as the user's long pressing finger on the pressable input surface 34 is released by a normal speed from the pressable input surface 34 so that the output voltage V becomes lower than the second voltage threshold Vth2 due to the release of the user's long pressing finger from the pressable input surface 34.

Additionally, even if the user's long press on the pressable input surface 34 is released more slowly so that the output voltage Vis maintained to be higher than or equal to the second voltage threshold Vth2, the above configuration of the controller 41 makes it possible to determine the termination of the user's long press on the pressable input surface 34 upon determination that the period T for which the absolute difference of the output voltage V of the pressure sensor 45a from the base voltage Vo is lower than the third voltage threshold Vth3 has been continued for at least the predetermined time threshold T1, so that the output voltage Vis determined to have converged to the base voltage Vo.

In particular, because the output voltage V of the pressure sensor 45a slightly oscillates while the pressable input surface 34 is continuously held down by the user's finger press on the pressable input surface 34, the absolute difference of the output voltage V of the pressure sensor 45a from the base voltage Vo exceeds the third voltage threshold Vth3 at least intermittently. This therefore makes it possible to prevent erroneous determination that the user's finger press on the pressable input surface 34 although the user's finger press on the pressable input surface 34 has been continuous.

Consequently, the configuration of the controller 41 uses the pressure sensor 45a to accurately determine either a user's short press or a user's long press on the pressable input surface 34.

The controller 41 can be configured to amplify the output voltage V of the pressure sensor 45a at a predetermined gain, and thereafter, perform the pressing determination routine based on the amplified output voltage V of the pressure sensor 45a. In this modification, a value of the gain used for the output voltage V employed in the determination in step S111 can be set to be higher than a value of the gain used for the output voltage V employed in the determination in step S109. The output voltage V employed in the determination in step S109 can be unamplified or amplified to be smaller than the output voltage V employed in the determination in step S111.

For example, the controller 41 can include a first determiner 41a that performs the determination in step S109 for determining whether the user's press on the pressable input surface 34 is terminated based on determination of whether a second sampled value of the output voltage V is lower than the second voltage threshold Vth2.

The controller 41 can include an amplifying unit 41c for amplifying the output voltage V by a predetermined gain. The controller 41 can functionally include a second determiner 41b that performs the determination in step S111 for determining whether the user's press on the pressable input surface 34 is terminated based on determination of whether the absolute difference of an amplified output voltage V of the pressure sensor 45a from the base voltage Vo is lower than or equal to the third voltage threshold Vth3.

Because a second sampled value of the output voltage V of the pressure sensor 45a to be compared with the second voltage threshold Vth2 in response to an immediate release of a user's touching finger from the pressable input surface 34 becomes a relatively high value. In contrast, because the output voltage V of the pressure sensor 45a to be compared with the third voltage threshold Vth3 slightly oscillates due to the slight vibrations of the touching finger muscles and/or the pyroelectric effect, the output voltage V of the pressure sensor 45a changes within a relatively low voltage range.

For this reason, setting a value of the gain used for the output voltage V, which is compared with the third voltage threshold Vth3, to be higher than a value of the gain used for the output voltage V, which is compared with the second voltage threshold Vth2, makes it possible to reliably recognize a relatively small pressure value based on a user's long press on the pressable input surface 34, thus determining that a user performs a finger's long press on the pressable input surface 34 with higher accuracy.

Second Embodiment

Figure 13:
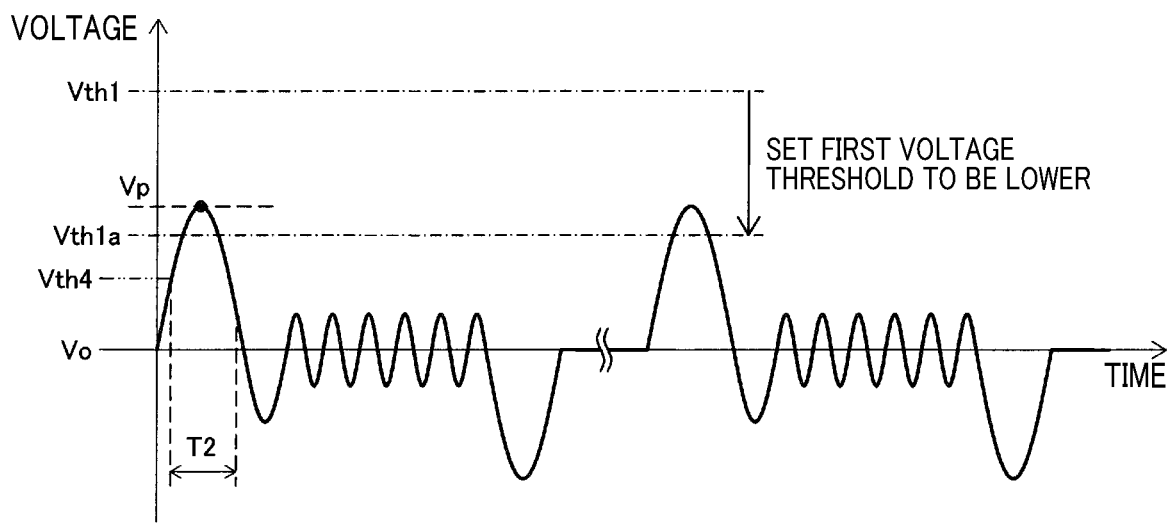
FIG. 13 is a graph schematically illustrating how the controller changes a value of a first voltage threshold according to a second embodiment of the present disclosure.
Figure 14:
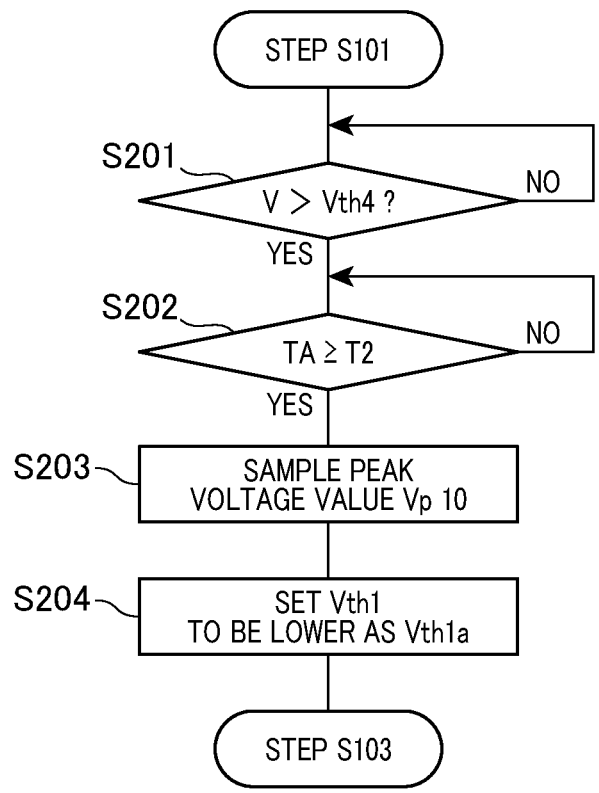
FIG. 14 is a flowchart schematically illustrating a routine of changing the first voltage threshold, which is carried out by the controller according to the second embodiment.

The following describes an optical information reader according to the second embodiment of the present disclosure with reference to FIGS. 13 and 14. The structure and/or functions of the optical information reader according to the second embodiment are mainly identical to those of the optical information reader 10 except for the following point that the controller 41 automatically changes the first voltage threshold Vth1 according to any of users who uses the optical information reader. The following therefore describes mainly the different points.

If the first threshold voltage Vth1 is set to a relatively high voltage value for reducing erroneous determination, a relatively small value of pressure on the pressable input surface 34 at a user's relatively weak press on the pressable input surface 34, i.e., a corresponding relatively small value of stress generated in the pressure sensor 45a, may cause a corresponding value of the output voltage V not to exceed the first threshold voltage Vth1. This may make it difficult for the controller 41 to determine the start of the user's relatively weak press, such as the user's relatively weak long press or user's relatively weak short press on the pressable input surface 34.

From the above viewpoint, the controller 41 uses a previously prepared fourth voltage threshold Vth4. The fourth voltage threshold Vth4 is previously determined as a voltage level relative to the base voltage Vo relative to the base voltage Vo. The fourth voltage threshold Vth4 is set to be sufficiently lower than the first voltage threshold Vth1 and is set such that the output voltage V of the pressure sensor 45a based on a user's weak press on the pressable input surface 34 reliably exceeds the fourth voltage threshold Vth4.

Then, as illustrated in FIGS. 13 and 14, following the operation in step S101, the controller 41 determines whether the sampled value of the output voltage V is higher than the fourth voltage threshold Vth4 in step S201.

Upon determination that the sampled value of the output voltage V is maintained to be lower than or equal to the fourth voltage threshold Vth4, the controller 41 determines no user's press on the pressable input surface 34 (NO in step S201), and the controller 41 repeats the operations in steps S101 and S201.

Otherwise, upon determination that the sampled value of the output voltage V is higher than the fourth voltage threshold Vth4 (YES in step S201), the controller 41 determines that the output voltage V has increased to above the fourth voltage threshold Vth4 due to a user's weak press on the pressable input surface 34.

After the determination that the output voltage V has increased to above the fourth voltage threshold Vth4, the controller 41 determines whether a period TA for which the output voltage V has been maintained to be lower than or equal to the first voltage threshold Vth1 has reached a predetermined time threshold T2 in step S202.

Upon determination that the period TA for which the output voltage V has been maintained to be lower than or equal to the first voltage threshold Vth1 has not reached the predetermined time threshold T2 (NO in step S202), the controller 41 repeats the determination in step S202.

Otherwise, upon determination that the period TA for which the output voltage V has been maintained to be lower than or equal to the first voltage threshold Vth1 has reached the predetermined time threshold T2 (YES in step S202), the controller 41 samples a peak of the output voltage V during the period TA as a peak voltage value Vp10 in step S203.

Following the operation in step S203, the controller 41 sets a value, i.e., a default value, of the first voltage threshold Vth1 to be lower than the peak voltage value Vp10 by a predetermined value as a lower first voltage threshold Vth1a see FIG. 13) in step S204, and thereafter, the controller 41 determines whether a currently sampled value of the output voltage V is higher than the lower first voltage threshold Vth1a as the first voltage threshold Vth1 in step S103.

The above configuration of the controller 41 according to the second embodiment automatically corrects the first voltage threshold Vth1 to be a lower first voltage threshold Vth1a upon detection of the peak voltage value Vp10, i.e., upon non-detection of the start of a user's weak touch (press) on the pressable input surface 34. This therefore enables the controller 41 to reliably determine the start of a user's weak touch (press) on the pressable input surface 34.

The controller 41 according to the second embodiment is configured to set a value, i.e., a default value, of the first voltage Vth1 to be lower than the peak voltage value Vp10 by the predetermined value as the lower first voltage threshold Vth1a upon detection of the peak voltage value Vp10, but the present disclosure is not limited to this configuration.

Specifically, the controller 41 can be configured to set the first voltage Vth1 to a lower value that is equal to the peak voltage value Vp10 as the lower first voltage threshold Vth1a upon detection of the peak voltage value Vp10.

As another example, the controller 41 can be configured to set, based on the absolute difference between the default value of the first voltage Vth1 and the peak voltage value Vp10, the first voltage Vth1 to a lower value that is a middle value between the default value of the first voltage Vth1 and the peak voltage value Vp10. As a further example, the controller 41 can be configured to set the first voltage Vth1 to be lower by a predetermined value.

The controller 41, which samples the peak of the output voltage V during the period TA as the peak voltage value Vp10 in step S203, can serve as, a peak voltage detector, and the controller 41, which sets the default value of the first voltage Vth1 to be lower than the peak voltage value Vp10 by the predetermined value as the lower first voltage threshold Vth1a, can serve as a threshold setter.

As a first modification of the second embodiment, the controller 41 can be configured to automatically correct the first voltage threshold Vth1 to be a higher value according to the magnitude of a user's touch (press) on the pressable input surface 34.

Specifically, the controller 41 can be configured to automatically correct the first voltage threshold Vth1 to be a higher value upon determination that the highest peak Vp1 (see FIG. 9A) of the output voltage V is significantly higher than the first voltage threshold Vth1. For example, the controller 41 can be configured to set, based on the absolute difference between the default value of the first voltage Vth1 and the highest peak Vp1, the first voltage Vth1 to a higher value that is a middle value between the default value of the first voltage Vth1 and the highest peak Vp1. As another example, the controller 41 can be configured to set the first voltage Vth1 to be higher by a predetermined value.

Third Embodiment

Figure 15:
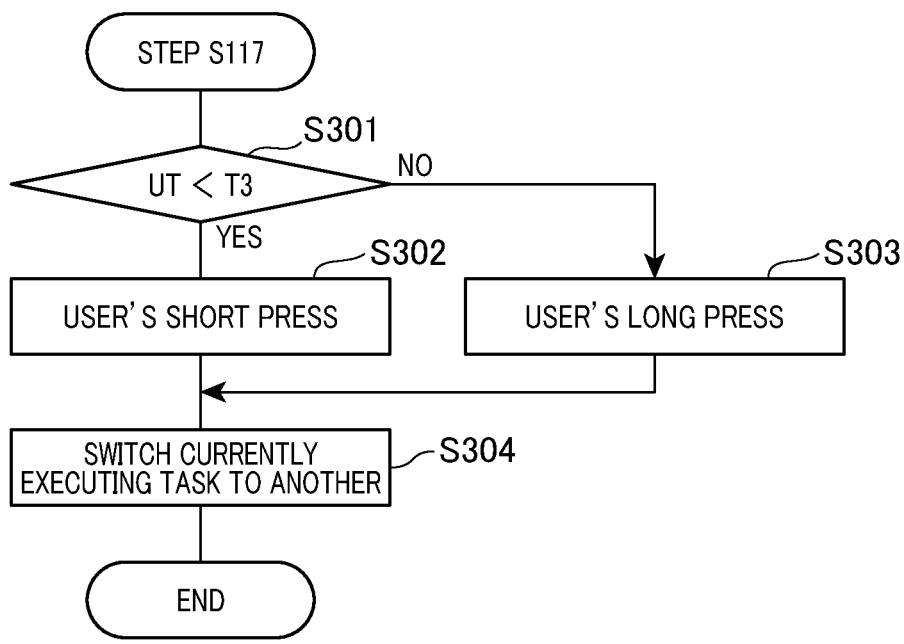
FIG. 15 is a flowchart schematically illustrating a task switching routine carried out by the controller according to a third embodiment of the present disclosure.

The following describes an optical information reader according to the third embodiment of the present disclosure with reference to FIG. 15. The structure and/or functions of the optical information reader according to the third embodiment are mainly identical to those of the optical information reader 10 except for the following point that the controller 41 switches a currently executing operation to another operation in accordance with a time defined from the determination of the start of a user's press on the pressable input surface 34 to the determination of the termination of the user's press on the pressable input surface 34. The following therefore describes mainly the different points.

Specifically, the time defined from the determination of the start of a user's press on the pressable input surface 34 in step S105 to the determination of the termination of the user's press on the pressable input surface 34 in step S117 is substantially identical to a user's actual pressing time on the pressable input surface 34. This therefore the time defined from the determination of the start of a user's press on the pressable input surface 34 in step S105 to the determination of the termination of the user's press on the pressable input surface 34 in step S117 will be referred to as a user's pressing time UT.

From this viewpoint, following the operation in step S117, the controller 41 according to the third embodiment measures the user's pressing time UT defined from the determination of the start of a user's press on the pressable input surface 34 in step S105 to the determination of the termination of the user's press on the pressable input surface 34 in step S117, and determines whether the user's pressing time UT defined from the determination of the start of a user's press on the pressable input surface 34 in step S105 to the determination of the termination of the user's press on the pressable input surface 34 in step S117 is smaller than a predetermined determination time threshold, such as one second, T3 in step S301.

Upon determination that the user's pressing time UT is smaller than the predetermined determination time threshold T3 (YES in step S301), the controller 41 determines that the user's press on the pressable input surface 34 is a user's short press on the pressable input surface 34 in step S302.

Otherwise, upon determination that the user's pressing time UT is greater than or equal to the predetermined determination time threshold T3 (NO in step S301), the controller 41 determines that the user's press on the pressable input surface 34 is a user's long press on the pressable input surface 34 in step S303.

Specifically, the controller 41 selectably switches one of tasks related to the user's press on the pressable input surface 34 to anther task related to the user's press on the pressable input surface 34 in accordance with a result of the determination of whether the user's press on the pressable input surface 34 is a user's short press or a user's long press in step S304.

For example, the controller 41 switches the currently executing information reading routine to the data transmission routine upon determination that the user's press on the pressable input surface 34 is a user's short press in step S304. Otherwise, the controller 41 switches the currently executing data transmission routine to the information reading routine upon determination that the user's press on the pressable input surface 34 is a user's long press in step S304. The completion of the operation in step S304 terminates the pressing determination routine.

As another example, the controller 41 is programmed to
(1) Start a radio communication task with the one or more external devices through the communication unit 49 in response to deter urination of the start of a user's press on the pressable input surface 34 in step S105
(2) Continue the radio communication task upon determination that the user's pressing time UT is smaller than the predetermined determination time threshold T3 so that the user's press on the pressable input surface 34 is a user's short press (YES in step S301 and S302) in step S304
(3) Terminate the radio communication task upon determination that the user's pressing time UT is greater than or equal to the predetermined determination time threshold T3 so that the user's press on the pressable input surface 34 is a user's long press (NO in step S301 and S303) in step S304

As described above, the controller 41 according to the third embodiment is configured to switch a currently executing operation to another operation in accordance with a result of determination of whether the user's press on the pressable input surface 34 is a user's short press or a user's long press.

As a further example, the controller 41 is programmed to
(1) Control the imaging unit 43 to cause the imaging unit 43 to start the image capturing task of capturing images of the target information code C upon determination of the start of a user's press on the pressable input surface 34 in step S105
(2) Terminate the image capturing task upon determination of the termination of the user's press on the pressable input surface 34 in step S117

This enables an increase in a time of performing the image capturing task to thereby capture many images of the target information code C, making it possible to increase the number of decoding tasks of the target information code C based on the captured many images of the target information code C. This results in the optical information reader 10 having a higher successful reading rate of information codes.

The controller 41 can be programmed to control at least one of (i) the pattern of light emitted by the light indicator 46, (ii) the pattern of the vibration generated by the vibrator 47, and the (iii) pattern of the buzzing sound generated by the buzzer 48 upon determination of the termination of the user's press on the pressable input surface 34, thus informing the user of the determination of the termination of the user's press on the pressable input surface 34 in step 117. Similarly, the controller 41 can be programmed to control at least one of (i) the luminescent state of light emitted by the light indicator 46, (ii) the state of the vibrations generated by the vibrator 47, and the (iii) pattern of the buzzing sound generated by the buzzer 48 upon determination of the start of a user's press on the pressable input surface 34, thus informing the user of the determination of the start of the user's press on the pressable input surface 34 in step 105.

Modifications

The present disclosure is however not limited to the above first to third embodiments, and can be variously modified or expanded as follows.

At least one of the thresholds Vth1, Vth2, Vth3, T1, T2, and T3 used by the pressing deter urination routine can be varied in accordance with any information inputted to the optical information reader 10.

For example, a user prepares an information code in which information indicative of a request of increasing the first voltage threshold Vth1 by a predetermined value is encoded. Then, a user locates the prepared information code in the field of view of the optical information reader 10, and thereafter, touches the pressable input surface 34 using his/her finger.

In response to deter urination by the pressing determination routine that there is a user's finger press on the pressable input surface 34, the controller 41 is programmed to perform the information reading routine to accordingly recognize the request of increasing the first voltage threshold Vth1 by the predetermined value. Then, the controller 41 is programmed to increase the first voltage threshold Vth1 by the predetermined value.

As another example, a user can use a setting tool, which enables the controller 41 to change various settings, such as the thresholds Vth1, Vth2, Vth3, T1, T2, and T3, of the optical information reader 10, to send the information indicative of the request of increasing the first voltage threshold Vth1 by a predetermined value. This enables the controller 41 to increase, based on the information sent to the optical information reader 10, the first voltage threshold Vth1 by the predetermined value.

The present disclosure is not limited to be applied to types of the optical information reader 10, which is configured to transmit the decoded data about the target information code C to the one or more external devices based on radio communications of the communication unit 49. Specifically, the present disclosure can be applied to other types of optical information readers, each of which is configured to transmit the decoded data about the target information code C to the one or more external devices through a cable drawn from a portion of the lower case 30; the portion of the lower case 30 is different from the grip portion 31, such as a bottom thereof.

The present disclosure is not limited to be applied to types of the optical information reader 10, which is configured to optically read information codes, but can be applied to other types of optical information readers, each of which is configured to optically capture an image of various types of optically readable information, such as textual information, to accordingly read, based on the captured image, the various types of optically readable information.

In particular, the assembly of the pressure sensor 45a and the controller 41 can serve as a "pressure sensor" according to the present disclosure. Specifically, the pressure sensor according to the present disclosure can be comprised of at least (i) a pressure sensing member that corresponds to the piezoelectric device (450, 451, 452), and (ii) the controller 41. The pressure sensing member (450, 451, 452) has the pressable input surface 34 that faces the first electrode 450 such that the pressure sensing member (450, 451, 452) is configured to generate an output voltage based on a deformation amount of the pressable input surface 34 upon a user's press on the pressable input surface 34.

The configurations and/or functions of the first to third embodiments can be combined with each other. A modified embodiment, which is created by eliminating a part of a selected one of the first to third embodiments, can be regarded as an embodiment of the present disclosure as long as the modified embodiment can solve the above problem and lie within the scope of the present disclosure.

Various inventive applications, which can be considered within the scope of the present disclosure, can be regarded as embodiments of the present disclosure.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A pressure sensor comprising:
   a pressure sensing member having a pressable input surface that is deformable, the pressure sensing member being configured to generate an output voltage based on a deformation amount of the pressable input surface; and
   a controller configured to:
      sample a value of the output voltage as a first sampled value;
      determine whether the first sampled value of the output voltage is higher than a predetermined first voltage threshold;
      determine a start of a user's press on the pressable input surface upon determination that the first sampled value of the output voltage is higher than the first voltage threshold;
      sample, after determination of the start of the user's press on the pressable input surface, a value of the output voltage as a second sampled value; and
      determine whether one of a first condition and a second condition is satisfied to accordingly determine whether the user's press on the pressable input surface is terminated,
   the first condition representing that the second sampled value of the output voltage is lower than a predetermined second voltage threshold,
   the second condition representing that the output voltage has converged to a base voltage,
   the base voltage being a value of the output voltage of the pressure sensing member with no user's press on the pressable input surface of the pressure sensing member.

2. The pressure sensor according to claim 1, wherein:
   the controller is configured to:
      determine whether a state where an absolute difference of the output voltage from the base voltage is lower than or equal to a predetermined third voltage threshold has been continuous at least for a predetermined time threshold,
   the third voltage threshold being determined such that an absolute difference of the third voltage threshold from the base voltage is lower by a predetermined value than a predetermined reference standard voltage, the reference standard voltage representing a standard value of the output voltage of the pressure sensing member upon a user's touch on the pressable input surface of the pressure sensing member; and
      determine that the output voltage has converged to the base voltage to accordingly determine that the second condition is satisfied upon determination that the state where the absolute difference of the output voltage from the base voltage is lower than or equal to the third voltage threshold has been continuous at least for the time threshold.

3. The pressure sensor according to claim 2, wherein:
the reference standard voltage is an average of amplitude values of the output voltage of the pressure sensing member, each of the amplitude values of the output voltage of the pressure sensing member being obtained for a corresponding one of a predetermined number of sample users while the corresponding one of the sample users is touching the pressable input surface of the pressure sensing member.

4. The pressure sensor according to claim 2, wherein:
the third voltage threshold is determined as a voltage level relative to the base voltage such that, when it is assumed that a part of a user is touching the pressable input surface, a first period for which a reference absolute difference between the output voltage of the pressure sensing member and the base voltage is higher than the third voltage threshold and a second period for which the reference absolute difference between the output voltage of the pressure sensing member and the base voltage is lower than the third voltage threshold appear alternately.

5. The pressure sensor according to claim 2, wherein:
the controller is configured to:
amplify a value of the output voltage at a predetermined first gain to accordingly obtain a first amplified value of the output voltage;
use the first amplified value of the output voltage as the second sampled value of the output voltage;
amplify the output voltage at a predetermined second gain after the second sampled value of the output voltage is deter mined to be higher than or equal to the second voltage threshold to accordingly obtain an amplified output voltage; and
use the amplified output voltage as the output voltage to thereby deter mine whether the state where the absolute difference of the amplified output voltage from the base voltage is lower than or equal to the third voltage threshold has been continuous at least for the time threshold,
the second gain being set to be higher than the first gain.

6. The pressure sensor according to claim 1, wherein:
the controller is configured to:
detect, if the output voltage which increased to above a predetermined fourth voltage threshold has been maintained to be lower than or equal to the first voltage threshold before determination of the start of the user's press on the pressable input surface, a peak of the output voltage; and
set a value of the first voltage threshold to be lower by a predetermined value than the detected peak.

7. The pressure sensor according to claim 1, wherein:
the controller is configured to:
measure a user's actual pressing time defined from the determination of the start of the user's press on the pressable input surface to the determination of the termination of the user's press on the pressable input surface; and
switch a currently executing task related to the user's press on the pressable input surface to another task related to the user's press on the pressable input surface in accordance with the measured user's actual pressing time.

8. The pressure sensor according to claim 1, further comprising:
a communication unit configured to perform radio communications with one or more external devices under control of the controller, wherein:
the controller is configured to:
measure a user's actual pressing time defined from the determination of the start of the user's press on the pressable input surface to the determination of the termination of the user's press on the pressable input surface;
perform a radio communication task with the one or more external devices through the communication unit;
determine whether the user's actual pressing time is greater than or equal to a predetermined second time threshold while performing the radio communication task with the one or more external devices through the communication unit; and
terminate the radio communication task upon determination that the user's actual pressing time is larger than or equal to the second time threshold.

9. An optical information reader comprising:
a casing having a reading port and a pressable input surface that is deformable;
an imaging unit configured to perform an image capturing task of optically capturing an image of target information to be read through the reading port;
a presser sensor comprising a pressure sensing member, the pressure sensing member being arranged to face the pressable input surface and configured to generate an output voltage based on a deformation amount of the pressable input surface; and
a controller configured to:
sample a value of the output voltage as a first sampled value;
determine whether the first sampled value of the output voltage is higher than a predetermined first voltage threshold;
determine a start of a user's press on the pressable input surface upon determination that the first sampled value of the output voltage is higher than the first voltage threshold;
sample, after determination of the start of the user's press on the pressable input surface, a value of the output voltage as a second sampled value; and
determine whether one of a first condition and a second condition is satisfied to accordingly determine whether the user's press on the pressable input surface is terminated,
the first condition representing that the second sampled value of the output voltage is lower than a predetermined second voltage threshold,
the second condition representing that the output voltage has converged to a base voltage,
the base voltage being a value of the output voltage of the pressure sensing member with no user's press on the pressable input surface of the pressure sensing member.

10. The optical information reader according to claim 9, wherein:
the controller is configured to:
determine whether a state where an absolute difference of the output voltage from the base voltage is lower than or equal to a predetermined third voltage threshold has been continuous at least for a predetermined time threshold, the third voltage threshold being determined such that an absolute difference of the third voltage threshold from the base voltage is lower by a predetermined value than a predetermined reference standard voltage, the reference standard voltage representing a standard value of the output voltage of the pressure sensing member upon a user's touch on the pressable input surface of the pressure sensing member; and determine that the output voltage has converged to the base voltage to accordingly determine that the second condition is satisfied upon determination that the state where the absolute difference of the output voltage from the base voltage is lower than or equal to the third voltage threshold has been continuous at least for the time threshold.

11. The optical information reader according to claim 10, wherein:

the reference standard voltage is an average of amplitude values of the output voltage of the pressure sensing member, each of the amplitude values of the output voltage of the pressure sensing member being obtained for a corresponding one of a predetermined number of sample users while the corresponding one of the sample users is touching the pressable input surface of the pressure sensing member.

12. The optical information reader according to claim 10, wherein:

the third voltage threshold is determined as a voltage level relative to the base voltage such that, when it is assumed that a part of a user is touching the pressable input surface, a first period for which a reference absolute difference between the output voltage of the pressure sensing member and the base voltage is higher than the third voltage threshold and a second period for which the reference absolute difference between the output voltage of the pressure sensing member and the base voltage is lower than the third voltage threshold appear alternately.

13. The optical information reader according to claim 10, wherein:

the controller is configured to:
amplify a value of the output voltage at a predetermined first gain to accordingly obtain a first amplified value of the output voltage;
use the first amplified value of the output voltage as the second sampled value of the output voltage;
amplify the output voltage at a predetermined second gain after the second sampled value of the output voltage is determined to be higher than or equal to the second voltage threshold to accordingly obtain an amplified output voltage; and
use the amplified output voltage as the output voltage to thereby determine whether the state where the absolute difference of the amplified output voltage from the base voltage is lower than or equal to the third voltage threshold has been continuous at least for the time threshold,
the second gain being set to be higher than the first gain.

14. The optical information reader according to claim 9, wherein:

the controller is configured to:
detect, if the output voltage which increased to above a predetermined fourth voltage threshold has been maintained to be lower than or equal to the first voltage threshold before determination of the start of the user's press on the pressable input surface, a peak of the output voltage; and
set a value of the first voltage threshold to be lower by a predetermined value than the detected peak.

15. The optical information reader according to claim 9, wherein:

the controller is configured to:
measure a user's actual pressing time defined from the determination of the start of the user's press on the pressable input surface to the determination of the termination of the user's press on the pressable input surface; and
switch a currently executing task related to the user's press on the pressable input surface to another task related to the user's press on the pressable input surface in accordance with the measured user's actual pressing time.

16. The optical information reader according to claim 9, further comprising:

a communication unit configured to perform radio communications with one or more external devices under control of the controller, wherein:
the controller is configured to:
measure a user's actual pressing time defined from the determination of the start of the user's press on the pressable input surface to the determination of the termination of the user's press on the pressable input surface;
perform a radio communication task with the one or more external devices through the communication unit;
determine whether the user's actual pressing time is greater than or equal to a predetermined second time threshold while performing the radio communication task with the one or more external devices through the communication unit; and
terminate the radio communication task upon determination that the user's actual pressing time is larger than or equal to the second time threshold.

17. The optical information reader according to claim 9, wherein:

the controller is configured to:
control the imaging unit to cause the imaging unit to start the image capturing task in response to determination of the start of the user's press on the pressable input surface; and
control the imaging unit to cause the imaging unit to terminate the image capturing task in response to determination of the termination of the user's press on the pressable input surface.

\* \* \* \* \*